(12) United States Patent
Arney et al.

(10) Patent No.: US 7,582,685 B2
(45) Date of Patent: Sep. 1, 2009

(54) MULTI-PHOTON POLYMERIZABLE PRE-CERAMIC POLYMERIC COMPOSITIONS

(75) Inventors: David S. Arney, Maplewood, MN (US); Feng Bai, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 278 days.

(21) Appl. No.: 11/721,754

(22) PCT Filed: Dec. 27, 2005

(86) PCT No.: PCT/US2005/047166

§ 371 (c)(1), (2), (4) Date: Jun. 14, 2007

(87) PCT Pub. No.: WO2006/071907

PCT Pub. Date: Jul. 6, 2006

(65) Prior Publication Data

US 2008/0194721 A1  Aug. 14, 2008

Related U.S. Application Data

(60) Provisional application No. 60/639,904, filed on Dec. 29, 2004.

(51) Int. Cl.
- C08J 3/28 (2006.01)
- C08G 75/02 (2006.01)
- C08G 77/28 (2006.01)
- G03C 1/54 (2006.01)
- G03C 1/73 (2006.01)

(52) U.S. Cl. .................. 522/25; 522/26; 522/27; 522/28; 522/99; 522/172; 430/286.1; 430/287.1; 427/510

(58) Field of Classification Search ............ 522/25, 522/26, 27, 28, 172, 99; 430/286.1, 287.1; 427/510

See application file for complete search history.

(56) References Cited

U.S. PATENT DOCUMENTS

| | | | |
|---|---|---|---|
| 3,729,313 A | 4/1973 | Smith | |
| 4,642,126 A | 2/1987 | Zador et al. | |
| 4,652,274 A | 3/1987 | Boettcher et al. | |
| 4,826,497 A * | 5/1989 | Marcus et al. ............. | 604/359 |
| 4,859,572 A | 8/1989 | Farid et al. | |
| 5,189,136 A | 2/1993 | Wudl et al. | |
| 5,545,676 A | 8/1996 | Palazzotto et al. | |
| 5,770,737 A | 6/1998 | Reinhardt et al. | |
| 5,859,251 A | 1/1999 | Reinhardt et al. | |
| 6,025,406 A | 2/2000 | Oxman et al. | |
| 6,100,405 A | 8/2000 | Reinhardt et al. | |
| 6,267,913 B1 * | 7/2001 | Marder et al. ............. | 252/582 |
| 6,652,978 B2 * | 11/2003 | Lukacs et al. ............. | 428/450 |
| 6,852,766 B1 * | 2/2005 | DeVoe ...................... | 522/25 |
| 7,297,374 B1 * | 11/2007 | Arney et al. ............... | 427/510 |
| 2003/0113657 A1 * | 6/2003 | Nagahara et al. .......... | 430/270.1 |
| 2004/0067431 A1 | 4/2004 | Arney et al. | |
| 2004/0068023 A1 | 4/2004 | Leatherdale et al. | |
| 2005/0112365 A1 * | 5/2005 | Hayashida et al. ........ | 428/336 |
| 2006/0069176 A1 * | 3/2006 | Bowman et al. ........... | 522/1 |

FOREIGN PATENT DOCUMENTS

| | | |
|---|---|---|
| EP | 1 239 332 | 9/2002 |
| JP | 2003 275671 | 9/2003 |
| JP | 2004/ 209344 | 7/2004 |
| WO | WO 98/21521 | 5/1998 |
| WO | WO 99/53242 | 10/1999 |
| WO | WO 01/96409 | 12/2001 |

OTHER PUBLICATIONS

Birot, M., et al., "Comprehensive Chemistry of Polycarbosilanes, Polysilazanes, and Polycarbosilazanes as Precursors of Ceramics", *Chem. Rev.*, vol. 95, pp. 1443-1477 (1995).

Cox, R. J., "Photographic Sensitivity," Chapter 15. Academic Press (1973).

Eaton, D. F. in "Advances in Photochemistry," edited by B. Voman et al., vol. 13, pp. 427-488, John Wiley and Sons, New York (1986).

Freimuth, H., et al., "Formation of Complex Ceramic Miniaturized Structures by Pyrolysis of Poly(vinylsilazane)", *J. Am. Ceram. Soc.*, vol. 79, No. 6, pp. 1457-1465 (1996).

Konetschny, C., et al., "Dense Silicon Carbonitride Ceramics by Pyrolysis of Cross-linked and Warm Pressed Polysilazane Powders", *J. of the European Ceramic Society*, vol. 19, pp. 2789-2796 (1999).

Liew, L-A., et al., "Sebrication of SiCN ceramic MEMS using injectable polymer-precursor technique", *Sensors and Actuators*, A 89, pp. 64-70 (2001).

Liew, L-A., et al., "Fabrication of SiCN MEMS by photopolymerization of pre-ceramic polymer", *Sensors and Actuators*, A 95, pp. 120-134 (2002).

(Continued)

*Primary Examiner*—Susan W Berman
(74) *Attorney, Agent, or Firm*—Thomas M. Spielbauer

(57) ABSTRACT

A multi-photon reactive composition comprises an ethylenically unsaturated liquid polysilazane precursor, a multi-functional thiol additive, a multi-ethylenically-unsaturated additive different from the polysilazane, and a multi-photon photocuring composition. The invention can be used to provide ceramic-based microstructures as, for example, high temperature resistant materials, including devices such as microcombustors, micro-heat-exchangers, sensor and actuator systems, microfluidic devices, and micro-optics systems that can be used independently or integrated into other systems.

20 Claims, No Drawings

OTHER PUBLICATIONS

Liu, Y., et al., *Proceedings of the 14 Annual International Conference on Micro Electrochemical Systems (MEMS2001)*, pp. 118-121, Interlaken, Switzerland, (Jan. 21-25, 2001).

Mann, C. K., and K. K. Barnes, "Electrochemical Reactions in Nonaqueous Systems" (1970).

Murray, C.B., et al., "Synthesis and Characterization of Nearly Monodisperse CdE (E = S, Se, Te) Semiconductor Nanocrystallites", *J. Am. Chem. Soc.*, vol. 115, pp. 8706-8715 (1993).

Xu, C., et al., "Measurement of two-photon excitation cross sections of molecular fluorophores with data from 690 to 1050 nm", *J. Opt. Soc. Am. B*, vol. 13, No. 3, pp. 481-491 (1996).

Wakabayashi, K., et al., "Studies on *s*-Triazines. I. Cotrimerization of Trichloroacetonitrile with Other Nitriles", *Bull. Chem. Soc. Japan*, vol. 42, pp. 2924-2930 (1969).

Weinburg, N. L., Ed., "Technique of Electroorganic Synthesis Part II Techniques of Chemistry," vol. V (1975).

* cited by examiner

MULTI-PHOTON POLYMERIZABLE PRE-CERAMIC POLYMERIC COMPOSITIONS

CROSS REFERENCE TO RELATED APPLICATIONS

This application is a national stage filing under 35 U.S.C. 371 of PCT/US2005/047166, flied Dec. 27, 2005, which claims priority to U.S. Provisional Application Ser. No. 60/639904, filed Dec. 29, 2004, the disclosure of which is incorporated by reference in its/their entirety herein.

STATEMENT OF PRIORITY

This application claims the priority of U.S. Provisional Application No. 60/639,904 filed Dec. 29, 2004.

FIELD

This invention relates to polysilazane- or polysiloxazane-containing compositions useful in providing ceramic-based microstructures for, for example, high temperature electronics, telecommunications, and biological applications.

BACKGROUND

Ceramic materials are well known and widely used for different applications due to some of their exceptional properties such as high modulus, hardness, high temperature stability and chemical resistance. However they are also heavy, brittle, and difficult to process. On the other hand, organic polymers are tough, flexible, light, and easy to fabricate; low modulus and relatively low decomposition temperatures are their main drawbacks. Pre-ceramic polymer technology is emerging as a promising process to produce materials that share the advantages of both polymers and ceramics while minimizing the disadvantages.

Furthermore new methods are needed to create micron-size (or even smaller) ceramic structures for applications such as microelectronics and microelectromechanical systems (MEMS). A particularly challenging area is creating three-dimensional (3D) ceramic structures. These application areas are very difficult using traditional ceramic technologies. Pre-ceramic polymers afford unique properties in responding to these requirements.

Many polymers such as polysilazanes are known to act as ceramic precursors and their use for production of ceramic structures has been reported. The formation of miniaturized ceramic structures by pyrolysis of poly (vinylsilazane) using LIGA (German Lithographie, Galvanoformung, and Abformung) process including deep X-ray lithography, electroforming, and plastic molding has been demonstrated. An injectable polymer-precursor technique has been detailed; also a microforged mold method to fabricate high temperature MEMS using polysilazanes has been disclosed. All of the described techniques, however, involve complex and time-consuming processing.

Photopolymerization provides an alternative route to construct solid microstructures. Photopolymerization techniques offer direct pattern formation capability, freestanding structures, and cost-effective processing. Through layer-by-layer processes, such as stereolithography, photopolymerization techniques can also allow for the fabrication of 3-dimensional structures. Efforts have been made to create ceramic microstructures using free radical initiated photopolymerization of liquid polysilazane; low photopolymerization speed, however, was observed.

Single photon polymerization techniques have been used to form patterned pre-ceramic polymer microstructures using thiol-ene chemistry including polysilazanes. Two-photon polymerization of polymer nanocomposites has been used to pattern 3D silica microstructures.

SUMMARY

Briefly, the present invention provides a multi-photon reactive composition comprising
  a) an ethylenically unsaturated liquid polysilazane precursor,
  b) a multi-functional thiol additive,
  c) a multi-functional ethylenically unsaturated additive different from the polysilazane, and
  d) a multi-photon photocuring composition.

In a preferred embodiment, the invention provides a multi-photon reactive composition comprising
  a) an ethylenically-unsaturated liquid polysilazane precursor,
  b) a multifunctional thiol additive,
  c) a multi-functional ethylenically unsaturated additive different from the polysilazane, and
  d) a multi-photon photocuring composition comprising at least one multi-photon photosensitizer, and optionally one or both of an electron acceptor and an electron donor.

Preferably, the multi-photon photosensitizer has a two-photon absorption cross-section at least 1.5 times that of fluorescein.

In another aspect of the invention, the present invention provides a method of making a pre-ceramic polymer or a ceramic (which is preferably microstructured) comprising:
  a) providing a multi-photon reactive composition comprising
    i) an ethylenically unsaturated liquid polysilazane precursor,
    ii) a multi-functional thiol additive,
    iii) a multi-functional ethylenically unsaturated additive different from the polysilazane; and
    iv) a multi-photon photocuring composition comprising at least one multi-photon photosensitizer, and optionally one or both of an electron acceptor and an electron donor,
  b) imagewise irradiating the composition (preferably, with a microstructured pattern) with sufficient light to at least partially react the composition, and
  c) optionally, removing a soluble portion of the multi-photon at least partially reacted composition (preferably, to provide a microstructured pre-ceramic polymer), and
  d) optionally, subjecting any remaining portion (which can be the entire at least partially reacted composition, if no removal has been carried out) of the at least partially reacted composition to an elevated temperature for sufficient time to at least partially pyrolyze the polysilazane (preferably, to provide a microstructured ceramic).

This method is advantageous in that it enables three-dimensional (3D) microstructuring of polysilazane materials in a single exposure step. Also, the method provides a composition with improved multi-photon photosensitivity as well as higher crosslink density compared to compositions without multifunctional ethylenically unsaturated additives. When the multifunctional ethylenically unsaturated additive is a silane, improved ceramic yield is realized. There are produced ceramic microstructures without the need for molds. The invention is especially useful for structures of complex topology. Also, by this method ceramic structures can be added to partially completed articles.

The present invention provides a method of multi-photon photosensitizing the ethylenically unsaturated polysilazane-, multifunctional thiol-, and multi-functional ethylenically unsaturated additive-comprising photoreactive composition. The multi-photon method comprises irradiating (preferably, pulse irradiating) the composition with light sufficient to cause simultaneous absorption of at least two photons, thereby inducing at least one radical-initiated chemical reaction where the composition is exposed to light. The photoreactive composition comprises: (a) at least one ethylenically unsaturated polysilazane, at least one multi-functional thiol, and at least one multi-functional ethylenically-unsaturated compound different from the polysilazane, as reactive species that are capable of undergoing a radical-initated chemical reaction; and (b) at least one multi-photon photocuring composition.

The method of the invention provides enhanced multi-photon photosensitivity by combining (in photochemically-effective amounts) at least one multi-photon photosensitizer having a relatively large two-photon absorption cross section (compared to those of many commonly available dyes) with optionally one or both of an electron acceptor and an electron donor so as to efficiently form a polymerization-initiating species (radical, etc.). The increased sensitivity of the method of the invention provides enhanced utility by, for example, allowing rapid fabrication of three-dimensional structures by means of three-dimensional light patterns and permitting the use of lower peak intensity lasers (including, for example, robust industrial lasers such as nanosecond and picosecond Nd:YAG lasers) for exposure.

It is believed novel in the art to produce patterned preceramic microstructures by use of multi-photon polymerization of polysilazane/thiol-ene compositions comprising a multi-functional ethylenically-unsaturated additive different from the polysilazane. The multi-photon technology enables fabrication of hollow or solid, three-dimensional microstructures with submicron resolution in a single exposure/development cycle. Complex 3-D geometries can be fabricated that cannot be formed by other methods such as molding or powder pressing.

To the best of our knowledge, multi-photon photocuring compositions have never been disclosed for a combination of polysilazane/thiol-ene polymerization involving a multi-functional ethylenically-unsaturated additive different from the polysilazane.

Definitions

As used in this patent application:

"a", "an", and "the" are used interchangeably with "at least one" to mean one or more of the elements being described;

"cure" means to effect polymerization and/or to effect crosslinking;

"electronic excited state" means an electronic state of a molecule that is higher in energy than the molecule's electronic ground state that is accessible via absorption of electromagnetic radiation, and that has a lifetime greater than $10^{-13}$ seconds;

"ethylenically unsaturated group" refers to a moiety having at least one carbon-carbon double bond;

"heteroalkyl" means an alkyl group containing at least one non-interfering (with reaction of the reactive species) hetero atom, the hetero atoms preferably being oxygen, nitrogen, and sulfur;

"exposure system" means an optical system plus a light source;

"multi-photon absorption" means simultaneous absorption of two or more photons to reach an electronic excited state that is energetically inaccessible by the absorption of a single photon of the same energy;

"optical system" means a system for controlling light, the system including at least one element chosen from refractive optical elements such as lenses, reflective optical elements such as mirrors, and diffractive optical elements such as gratings. Optical elements shall also include diffusers, waveguides, and other elements known in the optical arts;

"photochemically effective amounts" means amounts sufficient to enable the reactive species to undergo the desired reaction under the selected exposure conditions (as evidenced, for example, by a change in density, viscosity, color, pH, refractive index, or other physical or chemical property);

"photosensitizer" means a molecule that lowers the energy required to activate a photoreactive species by absorbing light of lower energy than is required by the photoreactive species for activation and interacting with the photoreactive species or electron acceptor to produce a photoinitiating species therefrom or itself is a molecule that initiates photopolymerization by absorbing light;

"polysilazane" refers to compounds having at least one of a linear, branched, or cyclic backbone comprising at least one Si—N linkage; these compounds comprise at least one ethylenically-unsaturated group or a SiH group;

"polysiloxazane" refers to compounds having at least one of a linear, branched, or cyclic backbone comprising both Si—N and Si—O linkages; for simplicity, in this application, "polysilazane" also includes "polysiloxazane" and "polyureasilazane";

"polyureasilazane" refers to compounds having at least one linear, branched, or cyclic backbone comprising at least one Si—N linkage and having at least one carbonyl group bonded to each of two nitrogen atoms;

"simultaneous" means two events that occur within the period of $10^{-14}$ seconds or less;

"substituted aryl" group means an aryl group substituted by non-interfering (with reaction of the reactive species) atoms such as one or more of halogens, alkyl groups, heteroalkyl groups, ethylenically-unsaturated groups;

"sufficient light" means light of sufficient intensity and appropriate wavelength to effect multi-photon absorption;

"thiol-ene" means a mixture of, or the reaction product of, at least one multi-functional thiol (HS)-containing compound and at least one multi-functional ethylenically unsaturated compound; the multi-functional thiol containing compound being different than the multi-functional ethylenically unsaturated compound; and "three-dimensional light pattern" means an optical image wherein the light energy distribution resides in a volume or in multiple planes and not in a single plane.

DETAILED DESCRIPTION

Polysilazanes

Useful polysilazanes, all of which can be random, alternating, or block polymers, include those linear polysilazanes generally represented by Formula I,

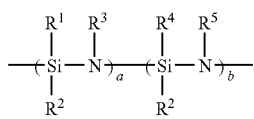

Formula I wherein $R^1$ and $R^2$ are independently H, a linear, branched, or cyclic aliphatic group having less than 9 carbon atoms, a linear, branched, or cyclic heteroalkyl group having less than 7 carbon atoms, a substituted or unsubstituted aryl group having less than 13 carbon atoms, an ethylenically unsaturated group, or where $R^1$ and $R^2$, taken together, may form a ring having less that 8 carbon atoms; $R^3$ and $R^5$ are independently H, a linear or branched alkyl group having less than 7 carbon atoms, or a linear or branched heteroalkyl group having less than 7 carbon atoms; $R^4$ is an ethylenically unsaturated group; a and b represent mole fractions such that the sum of a and b is 1, b is greater than zero, and preferably a is greater than b. The number average molecular weight of the polysilazanes of Formula I can range from about 160 g/mol to about 10,000 g/mol, preferably from about 300 g/mol to about 7,000 g/mol, more preferably from about 500 g/mol to about 3,000 g/mol, and most preferably from about 700 g/mol to about 2,000 g/mol.

Examples of useful cyclic polysilazanes include those generally represented by Formula II,

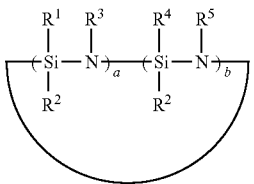

Formula II wherein $R^1$, $R^2$, $R^3$, $R^4$, $R^5$, a, and b are as described for the polysilazanes of Formula I. The number average molecular weight of the cyclic polysilazanes of Formula II can range from about 160 g/mol to about 3,000 g/mol, preferably from about 300 g/mol to about 2000 g/mol, and more preferably from about 350 g/mol to about 1500 g/mol. Examples of other useful cyclic polysilazanes include those that include both linear and cyclic polysilazanes moieties.

Examples of useful branched polysilazanes also include those generally represented by Formula I (linear polysilazanes with branches) or Formula II (cyclic polysilazanes with branches) where either or both of $R^1$ and $R^2$ in at least one or more of the repeat units of the polysilazanes have the structure represented by Formula III

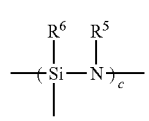

Formula III wherein $R^5$ is as described for Formula I, $R^6$ is H, a linear, branched, or cyclic aliphatic group having less than 9 carbon atoms, a linear, branched, or cyclic heteroalkyl group having less than 7 carbon atoms, an ethylenically unsaturated group, and c represents a mole fraction such that the sum of a, b, and c is 1, b is greater than zero, preferably b is greater than c, c is greater than zero, and preferably a is greater than b. The number average molecular weight of the branched polysilazanes can range from about 160 g/mol to about 3,000 g/mol, preferably from about 300 g/mol to about 2000 g/mol, and more preferably from about 350 g/mol to about 1500 g/mol. Examples of other useful branched polysilazanes include those that include multiple branches and those that include cyclic polysilazane moieties.

Polysilazanes that include Si—O units in addition to Si—N units are called polysiloxazanes and are useful in the present invention.

Useful linear polysiloxazanes include those generally represented by Formula IV,

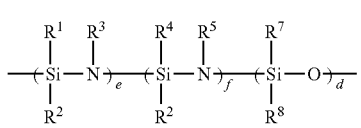

Formula IV wherein $R^1$, $R^2$, $R^7$, and $R^8$ are independently H, a linear, branched, or cyclic aliphatic group having less than 9 carbon atoms, a linear, branched, or cyclic heteroalkyl group having less than 7 carbon atoms, a substituted or unsubstituted aryl group having less than 13 carbon atoms, an ethylenically unsaturated group, or where $R^1$ and $R^2$, or $R^7$ and $R^8$, each pair independently taken together, form a ring having less that 8 carbon atoms; $R^3$ and $R^5$ are independently H, a linear or branched alkyl group having less than 7 carbon atoms, or a linear or branched heteroalkyl group having less than 7 carbon atoms; $R^4$ is an ethylenically unsaturated group; e, f, and d represent mole fractions such that the sum of e, f, and d is 1, f and d are each greater than zero, and preferably e is greater than both of f and d. The number average molecular weight of the polysiloxazanes of Formula IV can range from about 160 g/mol to about 10,000 g/mol, preferably from about 300 g/mol to about 7,000 g/mol, more preferably from about 500 g/mol to about 3,000 g/mol, and most preferably from about 700 g/mol to about 2,000 g/mol.

Useful polysiloxazanes may be cyclic or branched. Useful cyclic polysiloxazanes include polysiloxazanes that have cyclic portions that include Si—O linkages and polysiloxazanes in which the Si—O linkages are not in the cyclic portion. Useful branched polysiloxazanes include polysiloxazanes that are branched at either or both the Si—N or the Si—O linkages.

A particularly useful commercially available polysilazane, KION VL 20 (available from KiON Corp, Huntington Valley, Pa.), has the structure:

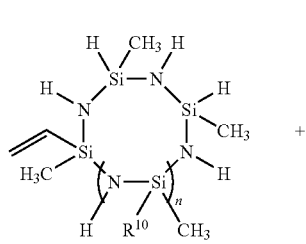

Formula V

-continued

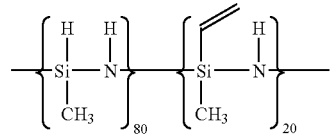

wherein n is an integer of 1-20, and $R^{10}$ can be H or a vinyl group.

Polysilazanes that include carbonyl groups that are bonded to each of two nitrogen atoms are called polyureasilazanes and are useful in the present invention.

Useful linear polyureasilazanes include those generally represented by Formula VI,

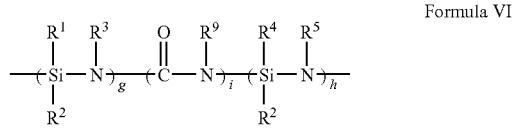

Formula VI wherein $R^1$, $R^2$, $R^3$, $R^4$, and $R^5$ are as described for the polysilazanes of Formula I, $R^9$ is H, a linear, branched, or cyclic aliphatic group having less than 7 carbon atoms, g, h, and i represent mole fractions such that the sum of g, h, and i is 1, both h and i are greater than zero, and preferably g is greater than h. The number average molecular weight of the polyureasilazanes of Formula VI can range from about 160 g/mol to about 10,000 g/mol, preferably from about 300 g/mol to about 7,000 g/mol, more preferably from about 500 g/mol to about 3,000 g/mol, and most preferably from about 700 g/mol to about 2,000 g/mol.

Useful cyclic polyureasilazanes include those generally represented by Formula VII,

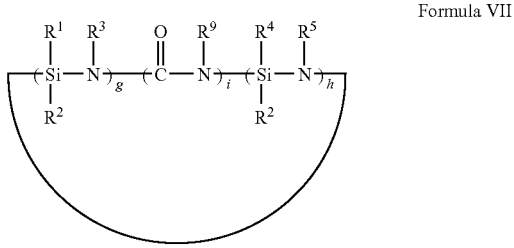

Formula VII wherein $R^1$, $R^2$, $R^3$, $R^4$, and $R^5$ are as described for the polysilazanes of Formula I and $R^9$ and g, h and i are as defined above for Formula VI. The number average molecular weight of the cyclic polyureasilazanes of Formula VII can range from about 160 g/mol to about 3,000 g/mol, preferably from about 300 g/mol to about 2000 g/mol, and more preferably from about 350 g/mol to about 1500 g/mol. Examples of other useful cyclic polyureasilazanes include those that include both linear and cyclic polyureasilazanes moieties.

Examples of useful branched polyureasilazanes include those generally represented by Formula VI (linear polyureasilazanes with branches) or Formula VII (cyclic polyureasilazanes with branches) where either or both of $R^1$ and $R^2$ in at least one of the repeat units of the polyureasilazanes have the structure represented by Formula III as described above.

Multi-Functional Thiol Additives

The invention includes at least one multi-functional thiol additive. The multi-functional thiol additive can be aliphatic, cycloaliphatic, aromatic, or combinations thereof, and can include at least one other heteroatom such as oxygen or nitrogen. The multi-functional thiol additive can be oligomeric or polymeric. Examples of multi-functional aliphatic thiol additives include 1,2-ethanedithiol and 1,6-hexanedithiol. Examples of multi-functional aromatic thiol additives include 1,2-benzenedithiol and 1,3-benzenedithiol. Examples of multi-functional aliphatic thiol additives that include heteroatoms include 2,2'-oxydiethanedithiol, 2,2'-(ethylenedioxy)diethanethiol, ethylene glycol bisthioglycolate, pentaerythritol tetrakis(3-mercaptopropionate), pentaerythritol tetrakis(2-mercaptoaceate), trimethylolpropane tris(3-mercaptopropionate), and trimethylolpropane tris(2-mercaptoaceate). Examples of oligomeric and polymeric multi-functional thiol additives include linear and branched oligomers and polymers of ethylene oxide having at least two thiol groups and oligomers and polymers having the structure

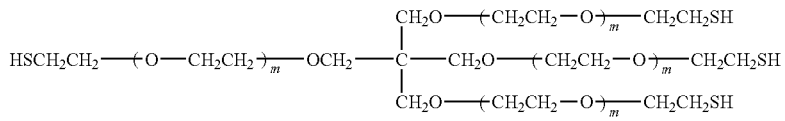

where each m is independently an integer from 1 to 100, preferably from 1 to 60, and more preferably from 1to 40.

Multi-Functional Ethylenically Unsaturated Additives

The invention includes at least one multi-functional ethylenically unsaturated additive. Examples of multi-functional ethylenically unsaturated additives include non-aromatic compounds such as 1,5-hexadiene and 1,9-decadiene, bicyclic compounds such as dicylcopentadiene, aromatic compounds such as divinylbenzene, and heteroatom-containing compounds such as vinyl esters, for example, diallyl diglycol carbonate, ethylene glycol divinyl ether and divinyl ethers of oligomers of ethylene oxide. Examples of useful multi-functional ethylenically unsaturated additives include vinyl silanes having at least two ethylenically unsaturated groups. Examples of such compounds include tetravinylsilane, tetrakis(vinyldimethylsiloxy)silane, 1,1,3,3-tetravinyldimethyldisiloxane, 1,3,5,7-tetravinyl-1,3,5,7-tetramethylcyclotetrasilazane, 1,3,5,7-tetravinyl-1,3,5,7-tetramethylcyclotetrasiloxane, octavinyl-T8-silsesquioxane, divinyldimethysilane, divinyltetramethyldisilance, divinyltetraphenyldisiloxane, 1,3-divinyltetramethyldisilazane, 1,3-divinyltetramethyldisiloxane, 1,3-divinyl-1,3-diphenyl-1,3-dimethyldisilazane, 1,3-divinyl-1,3-diphenyl-1,3-dimethyldisiloxane, and bis(bicyclohepenyl)tetramethyldisiloxane, all available from Gelest Inc., Morrisville, Pa.

The invention optionally includes at least one multi-functional (meth)acrylate. Multi-functional (meth)acrylates generally preferred include curable species, for example, addition-polymerizable acrylate or methacrylate (hereinafter frequently referred to as (meth)acrylates) monomers and oligomers and addition-crosslinkable acrylate or methacrylate polymers such as free-radically polymerizable or crosslinkable acrylates and methacrylates, and mixtures thereof.

Suitable multifunctional (meth)acrylates are described, for example, by Palazzotto et al. in U.S. Pat. No. 5,545,676 at column 1, line 65, through column 2, line 26, include di-, and poly-acrylates and methacrylates (for example, glycerol diacrylate, glycerol triacrylate, ethyleneglycol diacrylate, diethyleneglycol diacrylate, triethyleneglycol dimethacrylate,1,3-propanediol diacrylate, 1,3-propanediol dimethacrylate, trimethylolpropane triacrylate, 1,2,4-butanetriol trimethacrylate, 1,4-cyclohexanediol diacrylate, pentaerythritol triacrylate, pentaerythritol tetraacrylate, pentaerythritol tetramethacrylate, sorbitol hexacrylate, bis[1-(2-acryloxy)]-p-ethoxyphenyldimethylmethane, bis[1-(3-acryloxy-2-hydroxy)]-p-propoxyphenyldimethylmethane, tris (hydroxyethyl-isocyanurate) trimethacrylate, the bis-acrylates and bis-methacrylates of polyethylene glycols of molecular weight about 200-500, copolymerizable mixtures of acrylated monomers such as those of U.S. Pat. No. 4,652,274, and acrylated oligomers such as those of U.S. Pat. No. 4,642,126. Suitable reactive polymers include polymers with pendant (meth)acrylate groups, for example, having from 2 to about 50 (meth)acrylate groups per polymer chain. Examples also preferably include pentaerythritol triacrylate (PETA, Sartomer 344, available from Sartomer Co., Inc., Exton, Pa.) and trimethylolpropane triacrylate (TMPTA) that can be used as multi acrylate additives. Mixtures of two or more monomers, oligomers, and/or reactive acrylate polymers can be used if desired.

Multi-photon Photosensitizers

Multi-photon photosensitizers suitable for use in the multi-photon photocuring composition of the photoreactive compositions are those that are capable of simultaneously absorbing at least two photons when exposed to sufficient light and that have a two-photon absorption cross-section preferably at least about 1.5 times that of fluorescein.

Preferably, the photosensitizer is soluble in the reactive species (if the reactive species is liquid) or is compatible with the reactive species and with any binders (as described below) that are included in the composition. Most preferably, the photosensitizer is also capable of sensitizing 2-methyl-4,6-bis(trichloromethyl)-s-triazine under continuous irradiation in a wavelength range that overlaps the single photon absorption spectrum of the photosensitizer (single photon absorption conditions), using the test procedure described in U.S. Pat. No. 3,729,313. Using currently available material that test can be carried out as follows:

A standard test solution can be prepared having the following composition: 5.0 parts of a 5% (weight by volume) solution in methanol of 45,000-55,000 molecular weight, 9.0-13.0% hydroxyl content polyvinyl butyral (Butvar™ B76, Solutia, St. Louis, Mo.); 0.3 parts trimethylolpropane trimethacrylate; and 0.03 parts 2-methyl-4,6-bis(trichloromethyl)-s-triazine (see Bull. Chem. Soc. Japan, 42, 2924-2930 (1969)). To this solution can be added 0.01 parts of the compound to be tested as a photosensitizer. The resulting solution can then be knife-coated onto a 0.05 mm clear polyester film using a knife orifice of 0.05 mm, and the coating can be air dried for about 30 minutes. A 0.05 mm clear polyester cover film can be carefully placed over the dried but soft and tacky coating with minimum entrapment of air. The resulting sandwich construction can then be exposed for three minutes to 161,000 Lux of incident light from a tungsten light source providing light in both the visible and ultraviolet range (FCH™ 650 watt quartz-iodine lamp, General Electric Lighting, Cleveland, Ohio). Exposure can be made through a stencil so as to provide exposed and unexposed areas in the construction. After exposure the cover film can be removed, and the coating can be treated with a finely divided colored powder, such as a color toner powder of the type conventionally used in xerography. If the tested compound is a photosensitizer, the trimethylolpropane trimethacrylate monomer will be polymerized in the light-exposed areas by the light-generated free radicals from the 2-methyl-4,6-bis(trichloromethyl)-s-triazine. Since the polymerized areas will be essentially tack-free, the colored powder will selectively adhere essentially only to the tacky, unexposed areas of the coating, providing a visual image corresponding to that in the stencil.

The multi-photon photocuring composition preferably comprises photochemically effective amounts of (1) at least one multi-photon photosensitizer that is capable of simultaneously absorbing at least two photons and that has a two-photon absorption cross-section at least 1.5 times that of fluorescein (generally, greater than about $75 \times 10^{-50}$ $cm^4$ sec/photon, as measured by the method described by C. Xu and W. W. Webb in J. Opt. Soc. Am. B, 13, 481 (1996)); (2) optionally, at least one electron donor compound different from the multi-photon photosensitizer and capable of donating an electron to an electronic excited state of the photosensitizer (preferably, an electron donor compound having an oxidation potential that is greater than zero and less than or equal to that of p-dimethoxybenzene); and (3) at least one electron acceptor that is capable of being photosensitized by accepting an electron from an electronic excited state of the photosensitizer, resulting in the formation of at least one free radical (preferably, an electron acceptor selected from the group consisting of sulfonium salts, diazonium salts, azinium salts, chloromethylated triazines, and triarylimidazolyl dimers).

Preferably, the photosensitizer can also be selected based in part upon shelf stability considerations. Accordingly, selection of a particular photosensitizer can depend to some extent upon the particular reactive species utilized (as well as upon the choices of electron donor compound and/or photoinitiator).

Particularly preferred multi-photon photosensitizers include those exhibiting large multi-photon absorption cross-sections, such as Rhodamine B (that is, N-[9-(2-carboxyphenyl)-6-(diethylamino)-3H-xanthen-3-ylidene]-N-ethylethanaminium salts) having the structure

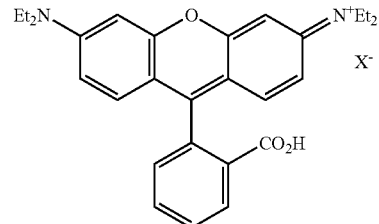

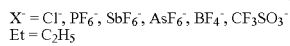

and the four classes of photosensitizers described, for example, by Marder and Perry et al. in International Patent Publication Nos. WO 98/21521 and WO 99/53242. The four classes can be described as follows: (a) molecules in which two donors are connected to a conjugated π (pi)-electron bridge; (b) molecules in which two donors are connected to a conjugated π (pi)-electron bridge which is substituted with one or more electron accepting groups; (c) molecules in which two acceptors are connected to a conjugated π (pi)-electron bridge; and (d) molecules in which two acceptors are connected to a conjugated π (pi)-electron bridge which is substituted with one or more electron donating groups (where "bridge" means a molecular fragment that connects two or more chemical groups, "donor" means an atom or group of atoms with a low ionization potential that can be bonded to a conjugated π (pi)-electron bridge, and "acceptor" means an atom or group of atoms with a high electron affinity that can be bonded to a conjugated π (pi)-electron bridge).

Representative examples of such preferred photosensitizers include the following, wherein Bu is butyl and Me is methyl:

The four above-described classes of photosensitizers can be prepared by reacting aldehydes with ylides under standard Wittig conditions or by using the McMurray reaction, as described in International Patent Publication No. WO 98/21521.

Other compounds are described by Reinhardt et al. (for example, in U.S. Pat. Nos. 6,100,405, 5,859,251, and 5,770,737) as having large multi-photon absorption cross-sections, although these cross-sections were determined by a method other than that described above. Representative examples of such compounds include:

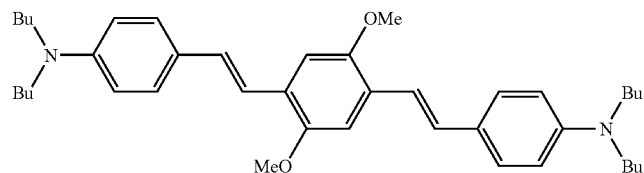

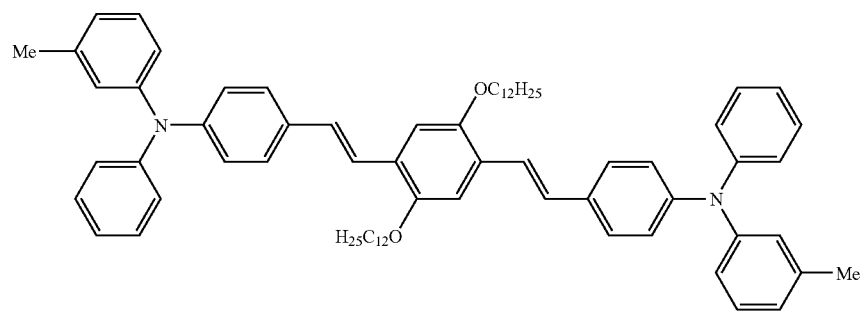

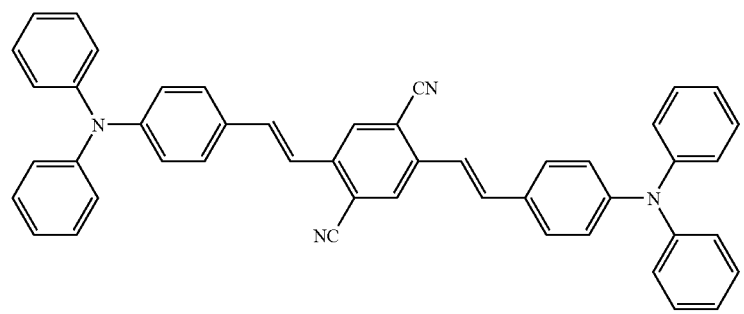

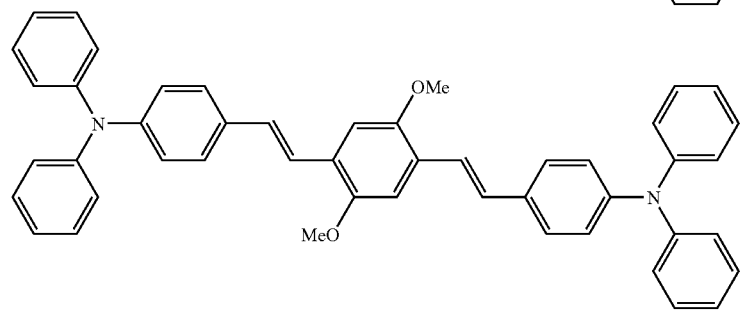

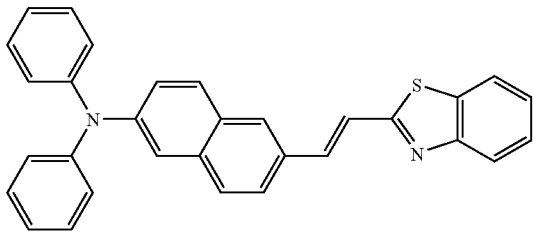

Another class of useful multi-photon photosensitizers are semiconductor nanoparticle quantum dots that are described in US2004/0067431 A1. These include at least one type of semiconductor nanoparticle that has at least one electronic excited state that is accessible by absorption of two or more photons. More particularly, semiconductor nanoparticle quantum dots that can be used as multi-photon photosensitizers in the compositions of the invention include those that have at least one electronic excited state that is accessible by absorption (preferably, simultaneous absorption) of two or more photons. Preferably, the quantum dots are substantially soluble (thus, substantially non-agglomerated) in the reactive species. Preferred nanoparticle quantum dots generally exhibit solubility in the reactive species that is greater than about 1.0 percent by weight (preferably, greater than about 2.0 percent; more preferably, and more preferably greater than about 5.0 percent), based upon the total weight of all components of the photoreactive composition. The nanoparticle quantum dots are preferably sufficiently soluble in the reactive species that the photoreactive composition is optically clear when viewed by the human eye.

Suitable nanoparticle quantum dots generally range in average diameter between about 1 nm and about 50 nm. Preferably, the nanoparticle quantum dots have an average diameter of at least about 1.5 nm; more preferably, at least about 2 nm. The nanoparticle quantum dots are preferably no greater than about 30 nm in average diameter; more preferably, no greater than about 10 nm. Nanoparticle quantum dots having a fairly narrow size distribution are preferred in order to avoid competitive one-photon absorption.

The nanoparticle quantum dots can comprise one or more semiconductor materials. Useful semiconductor materials include, for example, Group II-VI semiconductors (for example, ZnS, ZnSe, ZnTe, CdS, CdSe, CdTe, HgS, HgSe, HgTe, MgTe, and the like), Group III-V semiconductors (for example, GaN, GaP, GaAs, GaSb, InN, InP, InAs, InSb, AlAs, AlP, AlSb, AlS, and the like), Group IV semiconductors (for example, Ge, Si, and the like), Group I-VII semiconductors (for example, CuCl and the like), alloys thereof, and mixtures thereof (for example, ternary and quaternary mixtures). Preferred semiconductor nanoparticle quantum dots comprise a Group IV or a Group II-VI semiconductor (more preferably, a Group II-VI semiconductor; most preferably, a Group II-VI semiconductor comprising zinc or cadmium).

Semiconductor nanoparticles (for example, monoelement semiconductors such as silicon or germanium and compound semiconductors such as GaAs, InP, CdSe, or ZnS) can be synthesized using a wet chemical process based on standard colloidal chemistry. The general synthesis involves the rapid addition (for example, by injection) of molecular precursors of the semiconductor (for example, dimethyl cadmium and trioctylphosphine selenide for CdSe) into a hot coordinating solvent (for example, an amine or phosphine) that can serve to control growth and prevent aggregation of the nanoparticles (see, for example, Murray et al., J. Am. Chem. Soc.115: 8706 (1993)). In view of the highly reactive nature of the precursors and/or to prevent or minimize oxidation of the growing nanoparticles, the synthesis is generally carried out in an inert atmosphere (for example, a nitrogen atmosphere).

Choice of useful semiconductor nanoparticle quantum dots, details of their preparation, as well as desirable surface treatments to aid in their compatibility and dispersibility in the reactive species is described in US 2004/0067431 A1.

Electron Donor Compounds

Electron donor compounds useful in the multi-photon photocuring composition of the photoreactive compositions comprise those compounds (other than the photosensitizer itself) that are capable of donating an electron to an electronic excited state of the photosensitizer. Such compounds may be used, optionally, to increase the multi-photon photosensitivity of the photoinitiator system, thereby reducing the exposure required to effect photoreaction of the photoreactive composition. The electron donor compounds preferably have an oxidation potential that is greater than zero and less than or equal to that of p-dimethoxybenzene. Preferably, the oxidation potential is between about 0.3 and 1 volt vs. a standard saturated calomel electrode ("S.C.E.").

The electron donor compound is also preferably soluble in the reactive species and is selected based in part upon shelf stability considerations (as described above). Suitable donors are generally capable of increasing the speed of cure or the image density of a photoreactive composition upon exposure to light of the desired wavelength.

In general, electron donor compounds suitable for use with particular photosensitizers and electron acceptor compounds can be selected by comparing the oxidation and reduction potentials of the three components (as described, for example, in U.S. Pat. No. 4,859,572 (Farid et al.)). Such potentials can be measured experimentally (for example, by the methods described by R. J. Cox, "Photographic Sensitivity," Chapter 15, Academic Press (1973)) or can be obtained from references such as N. L. Weinburg, Ed., "Technique of Electroorganic Synthesis Part II Techniques of Chemistry," Vol. V (1975), and C. K. Mann and K. K. Barnes, "Electrochemical Reactions in Nonaqueous Systems" (1970). The potentials reflect relative energy relationships and can be used as described in WO 01/96409 (PCT/US01/19164).

Suitable electron donor compounds include, for example, those described by D. F. Eaton in "Advances in Photochemistry," edited by B. Voman et al., Volume 13, pp. 427-488, John Wiley and Sons, New York (1986); by Oxman et al. in U.S. Pat. No. 6,025,406 at column 7, lines 42-61; and by Palazzotto et al. in U.S. Pat. No. 5,545,676 at column 4, line 14 through column 5, line 18. Such electron donor compounds include amines (including triethanolamine, hydrazine, 1,4-diazabicyclo[2.2.2]octane, triphenylamine (and its triphenylphosphine and triphenylarsine analogs), aminoaldehydes, and aminosilanes), amides (including phosphoramides), ethers (including thioethers), ureas (including thioureas), sulfinic acid salts, salts of $(alkyl)_p(aryl)_q$borates (where p and q are integers and the sum of p and q is 4) (tetraalkylammonium salts being preferred), various organometallic compounds such as $SnR_4$ compounds (where each R is independently chosen from among alkyl, aralkyl (particularly, benzyl), aryl, and alkaryl groups) (for example, such compounds as $n-C_3H_7Sn(CH_3)_3$, $(allyl)Sn(CH_3)_3$, and $(benzyl)Sn(n-C_3H_7)_3$, ferrocene, and the like, and mixtures thereof. The electron donor compound can be unsubstituted or can be substituted with one or more non-interfering (with reaction of the reactive species) substituents. Particularly preferred electron donor compounds contain an electron donor atom (such as a nitrogen, oxygen, phosphorus, or sulfur atom) and an abstractable hydrogen atom bonded to a carbon or silicon atom alpha to the electron donor atom. Many examples of useful electron donor compounds are described in WO 01/96409.

Preferred electron donor compounds for free radical-induced reactions include amines that contain one or more julolidinyl moieties, alkylarylborate salts, and salts of aromatic sulfinic acids. However, for such reactions, the electron donor compound can also be omitted, if desired (for example, to improve the shelf stability of the photoreactive composition or to modify resolution, contrast, and reciprocity).

Electron Acceptors

Suitable electron acceptor compounds for the reactive species of the photoreactive compositions are those compounds (other than the photosensitizer itself) that are capable of being photosensitized by accepting an electron from an electronic excited state of a multi-photon photosensitizer, resulting in the formation of at least one free radical. Such electron acceptors include chloromethylated triazines (for example, 2-methyl-4,6-bis(trichloromethyl)-s-triazine, 2,4,6-tris(trichloromethyl)-s-triazine, and 2-aryl-4,6-bis(trichloromethyl)-s-triazine), diazonium salts (for example, phenyldiazonium salts optionally substituted with groups such as alkyl, alkoxy, halo, or nitro), sulfonium salts (for example, triarylsulfonium salts optionally substituted with alkyl or alkoxy groups, and optionally having 2,2' oxy groups bridging adjacent aryl moieties), azinium salts (for example, an N-alkoxypyridinium salt), and triarylimidazolyl dimers (preferably, 2,4,5 triphenylimidazolyl dimers such as 2,2',4,4',5,5'-tetraphenyl-1,1'-biimidazole, optionally substituted with groups such as alkyl, alkoxy, or halo), and the like, and mixtures thereof.

The electron acceptor is preferably soluble in the reactive species and is preferably shelf-stable (that is, does not spontaneously promote reaction of the reactive species when dissolved therein in the presence of the photosensitizer and the electron donor compound). Accordingly, selection of a particular electron acceptor can depend to some extent upon the particular reactive species, photosensitizer, and electron donor compound chosen, as described above.

Preferred electron acceptors include chloromethylated triazines, triarylimidazolyl dimers (more preferably, 2,4,5-triphenylimidazolyl dimers), sulfonium salts, and diazonium salts. More preferred are chloromethylated triazines and the 2,4,5-triphenylimidazolyl dimers.

Preparation of Photoreactive Composition

The reactive species (that is, the polysilazanes, thiols, and ethylenically-unsaturated additives), multi-photon photosensitizers, electron donor compounds, and electron acceptor compounds useful in the invention can be prepared by the methods described above and in the references cited or by other methods known in the art, and many are commercially available. The components of the invention can be combined under "safe light" conditions using any order and manner of combination (optionally, with stirring or agitation), although it is sometimes preferable (from a shelf life and thermal stability standpoint) to add the photoinitiator (electron acceptor) last (and after any heating step that is optionally used to facilitate dissolution of other components). Solvent can be used, if desired, provided that the solvent is chosen so as to not react appreciably with the components of the composition. Suitable solvents include, for example, acetone, dichloromethane, and acetonitrile. The reactive species itself can also sometimes serve as a solvent for the other components.

The components of the photocuring compositions are present in photochemically effective amounts (as defined above). Generally, the composition can contain at least about 5% (preferably, at least about 10%; more preferably, at least about 20%) up to about 99.79% (preferably, up to about 95%; more preferably, up to about 80%) by weight of one or more reactive species (ethylenically unsaturated polysilazane precursors, multi-functional thiol additives, and multi-functional ethylenically unsaturated additives); at least about 0.01% (preferably, at least about 0.1%; more preferably, at least about 0.2%) up to about 10% (preferably, up to about 5%; more preferably, up to about 2%) by weight of one or more photosensitizers; optionally, up to about 10% (preferably, up to about 5%) by weight of one or more electron donor compounds (preferably, at least about 0.1%; more preferably, from about 0.1% to about 5%); and optionally up to about 10% by weight of one or more electron acceptor compounds (preferably, from about 0.1% to about 5%) based upon the total weight of solids (that is, the total weight of components other than solvent).

The multi-functional thiol can be present in the reactive composition to provide a ratio of thiol groups to total ethylenically unsaturated groups of 4:1 to 1:4, preferably 2:1 to 1:2, and more preferably 1:1.3 to 1.3:1.

It may be desirable to add a thermal free radical initiator to aid in maintaining structural integrity during pyrolysis, such as any of organic peroxides, hydroperoxides, acyl peroxides, and azo compounds in an amount in the range of 0.001 to 5.0 weight percent, based on total solids in the composition. Preferred examples include benzoyl peroxide, dicumyl peroxide, tert-butyl hydroperoxide.

A wide variety of adjuvants can be included in the photoreactive compositions, depending upon the desired end use. Suitable adjuvants include solvents, diluents, resins, binders, plasticizers, pigments, dyes, inorganic or organic reinforcing or extending fillers, thixotropic agents, indicators, inhibitors, stabilizers, ultraviolet absorbers, medicaments (for example, leachable fluorides), and the like (at preferred amounts of about 10% to 90% by weight based on the total weight of the composition). The amounts and types of such adjuvants and their manner of addition to the compositions will be familiar to those skilled in the art.

Prior to exposure, the resulting photoreactive compositions can be coated on a substrate, if desired, by any of a variety of coating methods known to those skilled in the art (including, for example, knife coating and spin coating). The substrate can be, for example, a film, sheet, or other surface depending upon the particular application and the method of exposure to be utilized. Preferred substrates are generally sufficiently flat to enable the preparation of a layer of photoreactive composition having a uniform thickness. For applications where coating is less desirable, the photoreactive compositions can alternatively be exposed in bulk form. Following coating, the reactive composition can, optionally, be soft baked (for example on a hot plate or in an oven) to remove some or all of the residual solvent. The substrate can be made of any suitable material (e.g., glass, fused silica, silicon, calcium fluoride) and can be chosen from a wide variety of films, sheets, wafers, and other surfaces, depending upon the particular application and the method of exposure to be utilized. The substrate can optionally be pre-treated with a primer (for example, silane coupling agents) to enhance adhesion of the photoreactive composition to the substrate.

Multi-Photon Exposure System and Its Use

Useful exposure systems for multi-photon curing include at least one light source (usually a pulsed laser) and at least one optical element. Suitable light sources include, for example, femtosecond near-infrared titanium sapphire oscillators (for example, a Coherent Mira Optima 900-F, Santa Clara, Calif.) pumped by an argon ion laser (for example, a Coherent Innova). This laser, operating at 76 MHz, has a pulse width of less than 200 femtoseconds, is tunable between 700 and 980 nm, and has average power up to 1.4 Watts. However, in practice, any light source that provides sufficient intensity (to effect multi-photon absorption) at a wavelength appropriate for the photosensitizer (used in the photoreactive composition) can be utilized. (Such wavelengths can generally be in the range of about 300 to about 1500 nm; preferably, from about 600 to about 1100 nm; more preferably, from about 750 to about 850 nm. The upper limit of the pulse fluence is generally dictated by the ablation threshold of the photoreactive composition.) For example, Q-switched Nd:YAG lasers (for example, a Spectra-Physics Quanta-Ray PRO, Mountain View, Calif.), visible wavelength dye lasers (for example, a Spectra-Physics Sirah pumped by a Spectra-Physics Quanta-Ray PRO), and Q-switched diode pumped lasers (for example, a Spectra-Physics FCbar™) can also be utilized. Preferred light sources are near infrared pulsed lasers having a pulse length less than about $10^{-8}$ second (more preferably, less than about $10^{-9}$ second; most preferably, less than about $10^{-11}$ second). Other pulse lengths can be used provided that the above-detailed peak intensity and pulse fluence criteria are met.

Optical elements useful in carrying out the method of the invention include refractive optical elements (for example, lenses and prisms), reflective optical elements (for example, retroreflectors or focusing mirrors), diffractive optical elements (for example, gratings, phase masks, and holograms), polarizing optical elements (for example, linear polarizers and waveplates), diffusers, Pockels cells, waveguides, waveplates, and birefringent liquid crystals, and the like. Such optical elements are useful for focusing, beam delivery, beam/mode shaping, pulse shaping, and pulse timing. Generally, combinations of optical elements can be utilized, and other appropriate combinations will be recognized by those skilled in the art. It is often desirable to use optics with large numerical aperture to provide highly-focused light. However, any combination of optical elements that provides a desired intensity profile (and spatial placement thereof) can be utilized. For example, the exposure system can include a scanning confocal microscope (BioRad MRC600, Thornwood, N.Y.) equipped with a 0.75 NA objective (Zeiss 20X Fluar, Carl Zeiss Micro Imaging Inc., Thornwood, N.Y.).

Generally, multi-photon exposure of the photoreactive composition can be carried out using a light source (as described above) along with an optical system as a means for controlling the three-dimensional spatial distribution of light intensity within the composition. For example, the light from a pulsed laser can be passed through a focusing lens in a manner such that the focal point is within the volume of the composition. The focal point can be scanned or translated in a three-dimensional pattern that corresponds to a desired shape, thereby creating a three-dimensional image of the desired shape. The exposed or illuminated volume of the composition can be scanned either by moving the composition itself or by moving the light source (for example, moving a laser beam using galvo-mirrors).

If the light induces, for example, a reaction of the reactive species that produces a material having solubility characteristics different from those of the reactive species, the resulting image can optionally be developed by removing either the exposed or the unexposed regions through use of an appropriate solvent, for example, or by other art-known means. Cured, complex, three-dimensional objects can be prepared in this manner.

Exposure times generally depend upon the type of exposure system used to cause image formation (and its accompanying variables such as numerical aperture, geometry of light intensity spatial distribution, the peak light intensity during the laser pulse (higher intensity and shorter pulse duration roughly correspond to peak light intensity)), as well as upon the nature of the composition exposed (and its concentrations of photosensitizer, photoinitiator, and electron donor compound). Generally, higher peak light intensity in the regions of focus allows shorter exposure times, everything else being equal. Linear imaging or "writing" speeds generally can be about 5 to 100,000 microns/second using a laser pulse duration of about $10^{-8}$ to $10^{-15}$ second (preferably, about $10^{-11}$ to $10^{-14}$ second) and about $10^2$ to $10^9$ pulses per second (preferably, about $10^3$ to $10^8$ pulses per second).

As disclosed in Assignee's U.S. Patent Publication No. 2004/0068023, filed Oct. 2, 2002, the single or multi-photon reactive radiation induces a reaction in the reactive composition that produces a material having solubility characteristics different from those of the unexposed reactive composition. The resulting pattern of exposed and unexposed material can then be developed by removing either the exposed or the unexposed regions with an appropriate solvent. An optional post exposure bake following exposure but prior to development may be required for certain photoreactive compositions. Reacted, complex, seamless three-dimensional structures can be prepared in this manner.

The resulting structures can have any suitable size and shape, but the method of the invention is particularly well suited for adding a microstructure to a microstructured surface of an article. The structures can be formed on the surface of the article, or within or on a feature of the surface.

The photopatterned structure can be thermally treated (pyrolysis) to convert the pre-ceramic polymer to a ceramic material. Following the polymerization reaction, the resultant polymeric material is typically pyrolyzed to form the ceramic material. For example, depending on the conditions employed for the thermal treatment, amorphous or crystalline structures can be obtained. Amorphous structures are generally obtained particularly when the pyrolysis is carried out in a temperature range from about 700 to 1200° C., preferably from 900 to 1200° C. When the thermal treatment is carried out at higher temperatures, for instance from 1200 to 2000° C., preferably from 1500 to 2000° C., at least partially crystalline structures are typically obtained. Pyrolysis is typically carried out under a protective gas cover or a reactive gas cover (e.g., helium, argon, nitrogen, ammonia, etc.) or in a vacuum. Further, pyrolysis is typically performed for about 0.5 to 2 hours to convert the polymeric material to a ceramic material. Optionally, a ceramic material is subjected to additional processing following pyrolysis. For example, a stable body is typically obtained after a sintering procedure at temperatures of 900° C. up to 2000° C., preferably 1600-2000° C., for 0.5 to 2 hours or more.

After sintering, the structure has a substantially inorganic composition and dimensions that are smaller than prior to the sintering step.

Utility

Representative applications for these high temperature resistant materials include patterned ceramic devices such as microcombustors, micro-heat-exchangers, sensor and actuator systems, microfluidic devices, and micro-optics systems that can be used independently or integrated into other systems, such as microelectromechanical systems. Ceramics that can resist high temperatures are a good alternative to conventional polymeric material because of their superior thermal properties, corrosion and chemical resistance, high modulus, and hardness.

EXAMPLES

Objects and advantages of this invention are further illustrated by the following examples, but the particular materials and amounts thereof recited in these examples, as well as other conditions and details, should not be construed to unduly limit this invention.

Glossary

Unless otherwise noted, all procedures were carried out under a dry nitrogen atmosphere with dry and deoxygenated solvents and reagents. Unless otherwise noted, all solvents and reagents were or can be obtained from Aldrich Chemical Co., Milwaukee, Wis.

As used herein,

"VL20" refers to VL20 curable polysilazanes that were obtained from KiON Corporation, Huntingdon Valley, Pa.;

"Dye 1" refers to the multi-photon sensitizing dye bis-[4-(diphenylamino)stryl]-1-(2-ethylhexyloxy),4-(methoxy) benzene;

Preparation of Dye 1, Bis-[4-(diphenylamino)stryl]-1-(2-ethylhexyloxy),4-(methoxy)benzene A mixture of 2,5-bis(chloromethyl)-1-methoxy-4-(2-ethylhexyloxy)benzene (28.26 g), prepared essentially according to the procedure of U.S. Pat. No. 5,189,136 (Wudl et al.), and triethyl phosphite (37.4 g) was heated to reflux for 6 hours. After cooling, the product was heated under high vacuum to remove residual triethyl phosphite. A thick oil was obtained which slowly crystallized after several days and was used without further purification in the following step. To a mixture of the thick oil (11.60 g), 4-diphenylaminobenzaldehyde (12.34 g), and dry tetrahydrofuran (400 mL) was added dropwise potassium t-butoxide (1.0 M in tetrahydrofuran, 44 mL). The mixture was stirred for 3 hours at room temperature, then the solvent was removed under vacuum. Water (100 mL) was added to the residue, and the mixture was extracted several times with methylene chloride. The combined organic layers were washed with brine, dried over anhydrous magnesium sulfate and the solvent was removed under vacuum. The crude product was purified by column chromatography on silica gel using 30/70 methylene chloride/hexane to give 14.44 g of Dye 1, bis-[4-(diphenylamino)stryl]-1-(2-ethylhexyloxy),4-(methoxy)benzene, as a bright green solid.

Example 1

Curing a Thiol-Ene Preceramic Composition

A composition is prepared by dissolving bistrichloromethyltriazine (BTCMT) (0.040 g), and Dye 1 (0.019 g) in dichloromethane (0.54 g) in a brown bottle (10 ml) followed by the addition of VL20 (42.00 g), tetravinylsilane (0.075 g), and pentaerythritol tetra (3-mercaptopropionate (PETMP) (1.0 g). The mixture is then placed in an orbital shaker (VWR, Model DS-500) for 10 min to give a solution. Several drops of this mixture are placed on a clean glass microscope slide between two strips of adhesive tape (SCOTCH 810 MAGIC TAPE, available from 3M Company, St. Paul, Minn.) that are adhered to each slide approximately 1 cm apart. A glass cover slip is then placed over the mixture. Two-photon polymerization is performed using a diode pumped Ti:sapphire laser (Spectra-Physics, Mountain View, Calif.) operating at a wavelength of 800 nm, nominal pulse width 45 fs, pulse repetition rate of 80 MHz, and beam diameter of approximately 1.5 mm. The optical train consists of low dispersion turning mirrors, a beam expander, an optical attenuator to control the optical power, an acousto-optic modulator as a shutter, and a computer controlled 2-axis (x-y axes) galvom-irror scanning system mounted on a vertical z-axis stage. A 100× oil-immersion Plan Fluorite microscope objective (numeric aperture 1.4, available from Nikon Instruments, Inc., Melville, N.Y.) is used to focus the laser light into the sample. The position of the microscope objective is adjusted to set the focal point at the interface of the polymer composition and the glass slide. Under computer control, the focused laser is rastered to form a series of bars that are approximately 100 microns wide. The scan speed of the laser is varied from 0.67 mm per second to 43 mm per second and the average power of the laser is varied from approximately 7 mW to approximately 12 mW in order to determine the threshold writing speed as a function of average power. The threshold writing speed is the maximum scan speed at a given average power that provides a polymerized structure that remains intact following the development step described below. Following exposure of the sample to the laser, the sample is developed. The glass slide is washed with acetone to remove unpolymerized poly(vinylsilazanes). After the glass slide is dried in air at room temperature, it is examined using an optical microscope. Writing speeds in the range of 0.5 to 3.0 millimeters per second are realized.

Various unforeseeable modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows.

What is claimed is:

1. A composition comprising
  a) an ethylenically-unsaturated liquid polysilazane precursor,
  b) a multi-functional thiol additive,
  c) a multi-functional ethylenically unsaturated additive different from the polysilazane, and
  d) a multi-photon photocuring composition.

2. The composition according to claim 1 wherein said liquid polysilazane precursor comprises one or more units having one or more of the Formulae I, II, and IV:

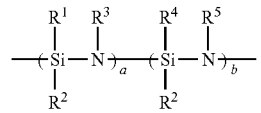

Formula I wherein $R^1$ and $R^2$ are independently H, a linear, branched, or cyclic aliphatic group having less than 9 carbon atoms, a linear, branched, or cyclic heteroalkyl group having less than 7 carbon atoms, an aryl group having less than 13 carbon atoms, an ethylenically unsaturated group, or where $R^1$ and $R^2$, taken together, can form a ring having less that 8 carbon atoms; $R^3$ and $R^5$ are independently H, a linear or branched alkyl group having less than 7 carbon atoms, or a linear or branched heteroalkyl group having less than 7 carbon atoms; $R^4$ is an ethylenically unsaturated group; a and b represent mole fractions such that the sum of a and b is 1 and b is greater than zero;

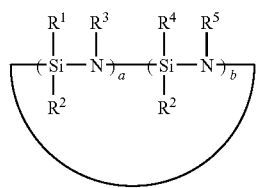

Formula II wherein $R^1$, $R^2$, $R^3$, $R^4$, $R^5$, a, and b are as described for the polysilazanes of Formula I;

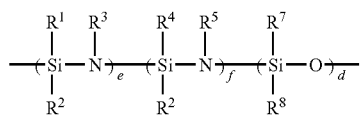

Formula IV wherein $R^1$, $R^2$, $R^7$, and $R^8$ are independently H, a linear, branched, or cyclic aliphatic group having less than 9 carbon atoms, a linear, branched, or cyclic heteroalkyl group having less than 7 carbon atoms, an aryl group having less than 13 carbon atoms, an ethylenically unsaturated group, or where $R^1$ and $R^2$, or $R^7$ and $R^8$, each pair independently taken together, form a ring having less that 8 carbon atoms; $R^3$ and $R^5$ are independently H, a linear or branched alkyl group having less than 7 carbon atoms, or a linear or branched heteroalkyl group having less than 7 carbon atoms; $R^4$ is an ethylenically unsaturated group; e, f, and d represent mole fractions such that the sum of e, f, and d is 1, and f and d are each greater than zero; and wherein $R^1$ or $R^2$ or both optionally has a structure represented by Formula III

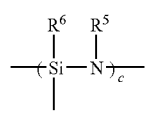

Formula III wherein $R^5$ is as described for Formula I, $R^6$ is H, a linear, branched, or cyclic aliphatic group having less than 9 carbon atoms, a linear, branched, or cyclic heteroalkyl group having less than 7 carbon atoms, an aryl group having less than 13 carbon atoms, an ethylenically unsaturated group, and c represents a mole fraction such that the sum of a, b, and c is 1 and c is greater than zero.

3. The composition according to claim 1 wherein said liquid polysilazane precursor comprises one or more units having the formula

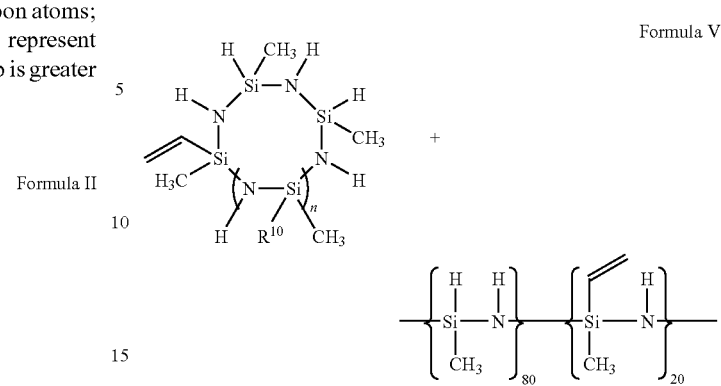

Formula V wherein n is an integer of 1-20 and $R^{10}$ is H or a vinyl group.

4. The composition according to claim 1 wherein said multi-functional thiol additive comprises one or more of aliphatic, cycloaliphatic, aromatic, oligomeric, and polymeric multi-functional thiol additives.

5. The composition according to claim 1 wherein said multi-functional thiol comprises one or both of pentaerythritol tetrakis(3-mercaptoproprionate) and trimethylolpropane tris(3-mercaptopropionate).

6. The composition according to claim 1 wherein said multi-functional ethylenically unsaturated additive comprises one or more of vinyl silanes, vinyl esters, bicyclic compounds, and (meth)acrylates.

7. The composition according to claim 1 wherein the multi-functional ethylenically unsaturated additive comprises one or more of tetravinyl silane, dicyclcopentadiene, diallyl diglycol carbonate, trimethylolpropane triacrylate, and trimethylolpropane trimethacrylate.

8. The composition according to claim 1 wherein said multi-photon photocuring composition comprises a multi-photon photosensitizer, and optionally one or both of an electron acceptor and an electron donor.

9. The composition according to claim 1 wherein said polysilazane precursor comprises a polysiloxazane.

10. The composition according to claim 9 wherein said polysiloxazane has a structure represented by Formula IV

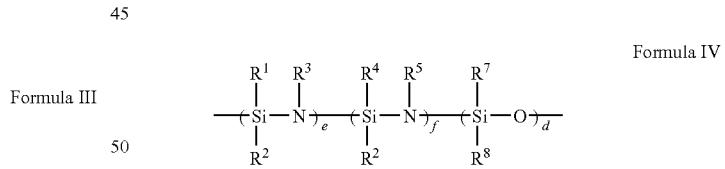

Formula IV wherein $R^1$, $R^2$, $R^7$, and $R^8$ are independently H, a linear, branched, or cyclic aliphatic group having less than 9 carbon atoms, a linear, branched, or cyclic heteroalkyl group having less than 7 carbon atoms, a substituted or unsubstituted aryl group having less than 13 carbon atoms, an ethylenically unsaturated group, or where $R^1$ and $R^2$, or $R^7$ and $R^8$, each pair independently taken together, form a ring having less that 8 carbon atoms; $R^3$ and $R^5$ are independently H, a linear or branched alkyl group having less than 7 carbon atoms, or a linear or branched heteroalkyl group having less than 7 carbon atoms; $R^4$ is an ethylenically unsaturated group; e, f, and d represent mole fractions such that the sum of e, f, and d is 1, and f and d are each greater than zero.

11. The composition according to claim 1 wherein said polysilazane precursor comprises a polyureasilazane.

12. The composition according to claim 11 wherein said polyureasilazane has a structure represented by at least one of Formula VI and Formula VII:

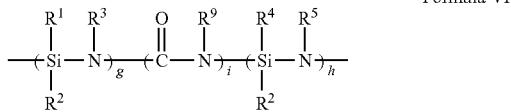

Formula VI wherein $R^1$, $R^2$, $R^3$, $R^4$, and $R^5$ are as described for the polysilazanes of Formula I, $R^9$ is H or a linear, branched, or cyclic aliphatic group having fewer than 7 carbon atoms, g, h, and i represent mole fractions such that the sum of g, h, and i is 1, both h and i are greater than zero, and preferably g is greater than h,

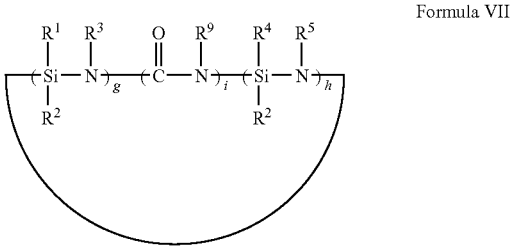

Formula VII wherein $R^1$, $R^2$, $R^3$, $R^4$, and $R^5$ are as described for the polysilazanes of Formula I and $R^9$ and g, h, and i are as defined above for Formula VI.

13. The composition according to claim 8 wherein said multi-photon photosensitizer absorbs at least two photons when exposed to sufficient light and has a two-photon absorption cross-section at least 1.5 times that of fluorescein.

14. The composition according to claim 8 wherein said multi-photon photosensitizer is selected from the group consisting of (a) Rhodamine B; (b) molecules in which two donors are connected to a conjugated π (pi)-electron bridge; (c) molecules in which two donors are connected to a conjugated π (pi)-electron bridge which is substituted with one or more electron accepting groups; (d) molecules in which two acceptors are connected to a conjugated π (pi)-electron bridge; and (e) molecules in which two acceptors are connected to a conjugated π (pi)-electron bridge which is substituted with one or more electron donating groups.

15. The composition according to claim 8 wherein said multi-photon photosensitizer is a fluorescein salt.

16. The composition according to claim 8 wherein said multi-photon photosensitizer comprises one or more semiconductor quantum dots.

17. The composition according to claim 8 wherein said electron acceptor comprises one or more of chloromethylated triazines, diazonium salts, sulfonium salts, azinium salts, triarylimidazolyl dimers, and mixtures thereof.

18. The composition according to claim 8 wherein said electron donor comprises one or more of amines, amides, ethers, ureas, sulfinic acids and their salts, salts of ferrocyanide, ascorbic acid and its salts, dithiocarbamic acid and its salts, salts of xanthates, salts of ethylene diamine tetraacetic acid, salts of $(alkyl)_p(aryl)_q$ borates (where p and q are integers and the sum of p and q is 4), $SnR_4$ compounds, where each R is independently chosen from among alkyl, aralkyl (particularly, benzyl), aryl, and alkaryl groups, ferrocene, and mixtures thereof.

19. A method comprising:
    a) providing a multi-photon reactive composition comprising
        i) an ethylenically unsaturated liquid polysilazane,
        ii) a multi-functional thiol additive,
        iii) a multi-ethylenically unsaturated additive different from the polysilazane; and
        iv) a multi-photon photocuring composition,
    b) imagewise irradiating the composition with sufficient light to at least partially react the composition,
    c) optionally, removing a soluble portion of the at least partially reacted composition, and
    d) optionally, subjecting any remaining portion of the at least partially reacted composition to an elevated temperature for sufficient time to at least partially pyrolyze the polysilazane.

20. The method according to claim 19 wherein said multi-photon curing composition comprises a multi-photon photosensitizer, and optionally one or both of an electron acceptor and an electron donor.

* * * * *